United States Patent [19]
Takahashi

[11] Patent Number: 5,786,639
[45] Date of Patent: Jul. 28, 1998

[54] WIRING MEMBER AND LEAD FRAME HAVING THE SAME

[75] Inventor: Yoshiharu Takahashi, Tokyo, Japan

[73] Assignee: Mitsubishi Denki Kabushiki Kaisha, Tokyo, Japan

[21] Appl. No.: 888,107

[22] Filed: Jul. 3, 1997

[30] Foreign Application Priority Data

Jan. 9, 1997 [JP] Japan ............................ 9-002310

[51] Int. Cl.$^6$ .......................... H01L 23/48; H01L 23/52; H01L 29/40
[52] U.S. Cl. ........................ 257/775; 257/773; 257/666
[58] Field of Search ..................... 257/775, 773, 257/666, 692

[56] References Cited

U.S. PATENT DOCUMENTS

| | | |
|---|---|---|
| 5,202,752 | 4/1993 | Honjo ........................... 257/692 |
| 5,216,278 | 6/1993 | Lin et al. . |
| 5,306,949 | 4/1994 | Yamada et al. .............. 257/692 |
| 5,444,294 | 8/1995 | Suzuki ......................... 257/692 |
| 5,508,563 | 4/1996 | Tazawa et al. .............. 257/773 |

FOREIGN PATENT DOCUMENTS

| | | |
|---|---|---|
| 57-79652 | 5/1982 | Japan . |
| 62-216257 | 9/1987 | Japan . |
| 63-258048 | 10/1988 | Japan . |
| 6-232305 | 8/1994 | Japan . |
| 7-335804 | 12/1995 | Japan . |
| 8-32012 | 2/1996 | Japan . |
| 8-125102 | 5/1996 | Japan . |

*Primary Examiner*—Mahshid D. Saadat
*Assistant Examiner*—S. V. Clark
*Attorney, Agent, or Firm*—Oblon, Spivak, McClelland, Maier & Neustadt, P.C.

[57] ABSTRACT

A wiring member comprising a first electrode portion electrically connected with an electrode formed on a surface of a semiconductor element, a second electrode portion electrically connected with an electrode formed on an external circuit, and a wiring portion which connects the first electrode portion with the second electrode portion. The first electrode portion, the second electrode portion and the wiring portion are formed of a plate-shaped conductive body, and a thickness of the wiring portion is made not more than half as thick as the first electrode portion or the second electrode portion. Fine wiring can be achieved by making the lead as a wiring member for electrically connecting the semiconductor element electrodes with the external electrodes of the semiconductor device not more than half as thick as the lead frame material at need.

20 Claims, 12 Drawing Sheets

WIRING MEMBER AND LEAD FRAME HAVING THE SAME

BACKGROUND OF THE INVENTION

The present invention relates to a wiring member for use in a semiconductor device, and a lead frame having the wiring member.

Recently, along with the higher integration and higher density of semiconductor devices, the number of input/output terminals of semiconductor elements have increased and the pitch of terminals becomes narrow.

The size and pitch of semiconductor element electrodes provided on the surfaces of semiconductor elements which compose a semiconductor device differ from those of the external electrodes provided, for example, on the external surface of the semiconductor device. Therefore, a wiring member is required to electrically connect the semiconductor element electrodes and the external electrodes of the semiconductor device.

As a wiring member, a lead frame or a printed wiring board has been used. The wiring with a lead frame can be defined as a single-layered wiring for connecting first electrode portions which are electrically connected with semiconductor element electrodes provided on the surfaces of the semiconductor elements via metallic wires or the like, with second electrode portions which are the external electrodes of the semiconductor device. On the other hand, the wiring with a wiring board can be defined as a multi-layered wiring for connecting first electrode portions which are electrically connected with semiconductor element electrodes via metallic wires or the like, with second electrode portions which are the external electrodes of the semiconductor device, by using conductive wirings formed on the surfaces of at least two layers of a double-sided board or multi-layered board and also a through hole which electrically connects the conductive wirings formed on different layers.

FIG. 22 shows a sectional view of a semiconductor device employing a conventional wiring board which has been disclosed, for example, in Japanese Unexamined Patent Publication No. 79652/1982. In this drawing, 8 represents a semiconductor element, 9 represents a semiconductor element electrode which is formed on the surface of the semiconductor element, 10 represents a printed wiring board on which surface the semiconductor element 8 is mounted. 11 represents a conductive wiring formed on the surface of the printed wiring board 10. 12 represents a metallic wire, 13 represents a through hole, 14 represents an external terminal formed on the back surface of the printed wiring board 10, and 15 represents sealing resin. In the resin-sealing semiconductor device where the semiconductor element 8 is mounted on the printed wiring board 10 and sealed with the sealing resin 15, the semiconductor element electrode 9 formed on the surface of the semiconductor element 8 is electrically connected with one end of the conductive wiring 11 provided on the top surface of the printed wiring board 10 via the metallic wire 12, the one end being located in the vicinity of the semiconductor element 8. The other end of the conductive wiring 11 is connected with the external terminal 14 formed on the back surface of the printed wiring board 10 via the through hole 13.

FIG. 23 shows a sectional view of a semiconductor device employing another conventional wiring board disclosed in Japanese Unexamined Patent Publication No. 258048/1988. In this drawing, 8 represents a semiconductor element, 9 represents a semiconductor element electrode formed on the surface of the semiconductor element, 16 represents a multi-layered printed wiring board on which surface the semiconductor element 8 is mounted. 11 represents a conductive wiring formed on the surface of the multi-layered printed wiring board 16, 17 represents an internal wiring formed in the inner layers of the multi-layered printed wiring board 16, 18 represents a blind hole for electrically connecting all the layers of the multi-layered printed wiring board 16, 14 represents an external terminal formed on the back surface of the multi-layered printed wiring board 16, 19 represents a tape (TAB tape) having a wiring pattern for electrically connecting the semiconductor element electrode 9 with the conductive wire 11 formed on the surface of the multi-layered printed wiring board 16, and 15 represents sealing resin. In the resin-sealing semiconductor device where the semiconductor element 8 is mounted on the multi-layered printed wiring board 16 and sealed with the sealing resin 15, the semiconductor element electrode 9 and the conductive wiring 11 formed on the surface of the multi-layered printed wiring board 16 are electrically connected with each other by means of the TAB tape 19. Also, the conductive wiring 11 is connected with the external terminal 14 formed on the back surface of the multi-layered printed wiring board 16 via the blind hole 18 and the internal wiring 17. The semiconductor device disclosed in Japanese Unexamined Patent Publication No. 258048/1988 can mount a semiconductor element having more terminals than the semiconductor element 8 disclosed in Japanese Unexamined Patent Publication No. 79652/1982 because it employs the multi-layered printed wiring board 16 having the internal wire 17 and the blind hole 18, and the TAB tape 19.

When a wiring board is used as a wiring member for electrically connecting the electrodes on the surfaces of the semiconductor elements with the external electrodes of the semiconductor device, copper foil having a thickness of 25 to 75 μm is used in wiring parts, which makes it possible to form a wiring pitch of 50 to 150 μm. In addition, the external electrodes of a semiconductor device having a large wiring pitch due to formation of soldering bump or the like are formed on the surface opposite to the surface on which the semiconductor elements are mounted, so that the semiconductor device can be downsized.

FIG. 24 shows a sectional view of a semiconductor device employing a conventional lead frame. In this drawing, 8 represents a semiconductor element, 9 represents a semiconductor element electrode formed on the surface of the semiconductor element, 20 represents a die pad on which semiconductor elements are mounted, 21 represents die bond resin which sticks the semiconductor elements on the die pad 20, 4 represents a first electrode portion of the lead frame, 5 represents a second electrode portion of the lead frame, 2 represents a wiring portion of the lead frame, 12 represents a metallic thin wire for electrically connecting the semiconductor element electrode 9 with the first electrode portion 4, 15 represents sealing resin which seals the semiconductor elements, 22 represents an external circuit, and 23 represents an electrode formed on the external circuit which is soldered with the second electrode portion 5 by means of solder 24 or the like.

FIG. 25 shows a sectional view of a lead frame for explaining the forming method of the lead frame by a conventional etching process. In this drawing, 1 represents a conductive metal plate (lead frame material) having a thickness of 125 to 200 μm, and 3 represents an etching mask having a predetermined pattern, the same pattern being formed on both surfaces of the conductive metal plate 1. 2 represents a wiring portion of the lead frame, which is formed by etching the conductive metal plate 1 from both surfaces to penetrate a portion which is not covered with the etching mask. Since the conventional lead frame is formed in this manner, when the conductive metal plate 1 having a thickness of 125 to 200 μm is used, the interval between adjacent wiring portions 2 must be about the same as the thickness of the conductive metal plate 1. Furthermore, in order to secure the etching process, the minimum pitch of the lead frame has been in a range of 210 to 250 μm, which is about twice the thickness of the conductive metal plate 1.

In order to shorten the pitch of the conventional lead frame, when the portion of the lead frame wire-bonded with a semiconductor element electrode is defined as a first electrode portion and the portion soldered with an external circuit is defined as a second electrode portion, methods of reducing the thickness of the first electrode portion by etching and then shortening the wiring interval are disclosed in Japanese Unexamined Patent Publication Nos. 45967/1990 and 335804/1995. FIG. 26 shows the process of producing the lead frame which has been disclosed in Japanese Unexamined Patent Publication No. 335804/1995. In this drawing, 1 represents a conductive metal plate which is a lead frame material, 3a and 3b represent etching masks, and 4 represents the first electrode portion. The etching mask 3b formed on one surface of the conductive metal plate 1 has an opening for forming the shape of the first electrode portion 4, and the etching mask 3a formed on the other surface of the conductive metal plate 1 has an opening for etching the other surface entirely to make it plain. 23 represents a recess which has been etched to be made plain by the etching mask 3a, and 24 represents an etching resistance layer. First of all, the etching masks 3a and 3b are formed on the surfaces of the conductive metal plate 1 (FIG. 26(a)), and etching process is started on both surfaces and temporarily suspended when the depth of the recess 23 reaches two-thirds of the thickness of the conductive metal plate 1 (FIG. 26(b)). The etching resistance layer 24 is formed on the side of the conductive metal plate 1 having the recess 23, thereby preventing the etching process from further proceeding (FIG. 26(c)). Then, the etching process is continued on the side of the conductive metal plate 1 having the opening for forming the first electrode portion 4 until the etching reaches the etching resistance layer 24 to form the first electrode portion 4 (FIG. 26(d)). Finally, the etching resistance layer 24 and the etching masks 3a and 3b are removed, thereby completing the lead frame (FIG. 26(e)). FIG. 27 is a sectional view of the lead frame thus formed. When the thickness T of the conductive metal plate 1 is 150 μm, the thickness $T_2$ of the first electrode portion 4 of the lead becomes 50 μm, which makes it possible to shorten the lead pitch. 5 represents a second electrode portion which is the external electrode of the semiconductor device, and 20 is a die pad on which a semiconductor element is mounted.

Japanese Unexamined Patent Publication Nos. 216257/1987 and 232305/1994 have disclosed methods of reducing the thickness of the lead by forming the etching masks 3 alternately on both surfaces of the conductive metal plate 1 which is a lead frame material and of shortening the lead pitch by providing the lead on both sides as shown in FIG. 28. However, such a thinned lead has a drawback that since etched surfaces are exposed alternately, if this is used as an electrode to wire-bond with the semiconductor element, then stitch bond comes off between the etched rough surface and the semiconductor element.

As described hereinbefore, when a multi-layered wiring board is used as a wiring member, a larger number of input/output terminals of a semiconductor element (semiconductor element electrodes) and a shorter pitch can be realized from a viewpoint of size. However, the through hole and the blind hole which electrically connect different wirings formed on different layers of the wiring board require a drilling process. As a result, there is a problem that the cost of the semiconductor device is increased by the damage of the drill, the cleaning of the drilled surfaces, the protection of the wiring board from cutting oil for the drill and cutting powder, and the like.

On the other hand, when a lead frame is used as a wiring member, there has been proposed a technique which shortens the lead pitch, but no technique has been proposed for the external electrodes of the semiconductor device. Therefore, a wiring distance which is the same as or larger than the conventional one is needed between the small-pitched first electrode portions and the large-pitched second electrode portions (external electrodes). In addition, there has been a problem that a large pitch and a large area are required to form a soldering bump or the like, and as a result, it is impossible to achieve a miniaturized semiconductor device.

The present invention has been achieved to solve these problems, and intends to realize the construction of shortening the wiring interval which has been realized only by using a multi-layered wiring board, by using a lead frame and a wiring member which composes the lead frame. The present invention has an object of providing a wiring member which can achieve a larger number and a smaller pitch of pins of the input/output terminals of a semiconductor element and further achieve the downsizing and cost reduction of a semiconductor device, and a lead frame having such a wiring member.

SUMMARY OF THE INVENTION

In accordance with the present invention, there is provided a wiring member comprising a first electrode portion electrically connected with an electrode formed on a surface of a semiconductor element, a second electrode portion electrically connected with an electrode formed on an external circuit, and a wiring portion which connects the first electrode portion with the second electrode portion, wherein the first electrode portion, the second electrode portion and the wiring portion are formed of a plate-shaped conductive body, and a thickness of the wiring portion is made not more than half as thick as the first electrode portion or the second electrode portion.

The wiring portion might be provided on one surface of the plate-shaped conductive body.

Further, the wiring portions might be dispersedly provided on both surfaces of the plate-shaped conductive body.

The thickness of the first electrode portion and the second electrode portion might be the same as that of the plate-shaped conductive body.

Moreover, the thickness of either the first electrode portion or the second electrode portion might be the same as that of the plate-shaped conductive body, and the thickness of the other might be not more than half of that of the plate-shaped conductive body.

Furthermore, the first electrode portion or the second electrode portion whose thickness is not more than than half of that of the plate-shaped conductive body is pressed to make their surfaces plane.

In accordance with the present invention, there is further provided a wiring member comprising a first electrode portion electrically connected with an electrode formed on a surface of a semiconductor element, a second electrode portion electrically connected with an electrode formed on an external circuit, a wiring portion which connects the first electrode portion with the second electrode portion, and a connecting portion formed in a part of the wiring portion to connect the wiring portion, wherein the first electrode portion, the second electrode portion, the wiring portion and the connecting portion are formed of a plate-shaped body, and each thickness of the first electrode portion, the second electrode portion, and the wiring portion is made not more than half as thick as the connecting portion.

The connecting portion might be a portion where the wiring portion and either of the first electrode portion or the second electrode portion which is wider than the wiring portion are overlapped with each other.

Further, the connecting portions including either of the first electrode portion or the second electrode portion formed on adjacent wiring portions might be arranged not to align laterally.

The wiring portion might be formed from the plate-shaped conductive body by etching.

At least one surface of the first electrode portion or the second electrode portion might not been subjected to etching process.

The lead frame of the present invention is provided with plural wiring members.

DETAILED DESCRIPTION

Embodiment 1

The lead frame of the present embodiment of the present invention is described hereinafter, based on the drawings.

Figure 1:
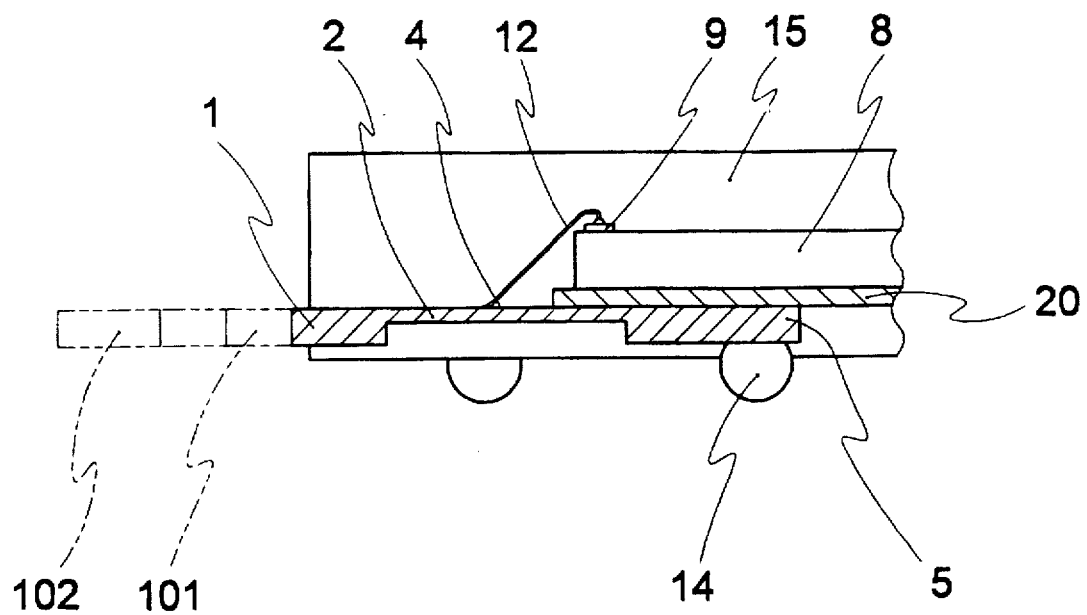
FIG. 1 is a sectional view of a lead frame of the first embodiment of the present invention.
Figure 2:
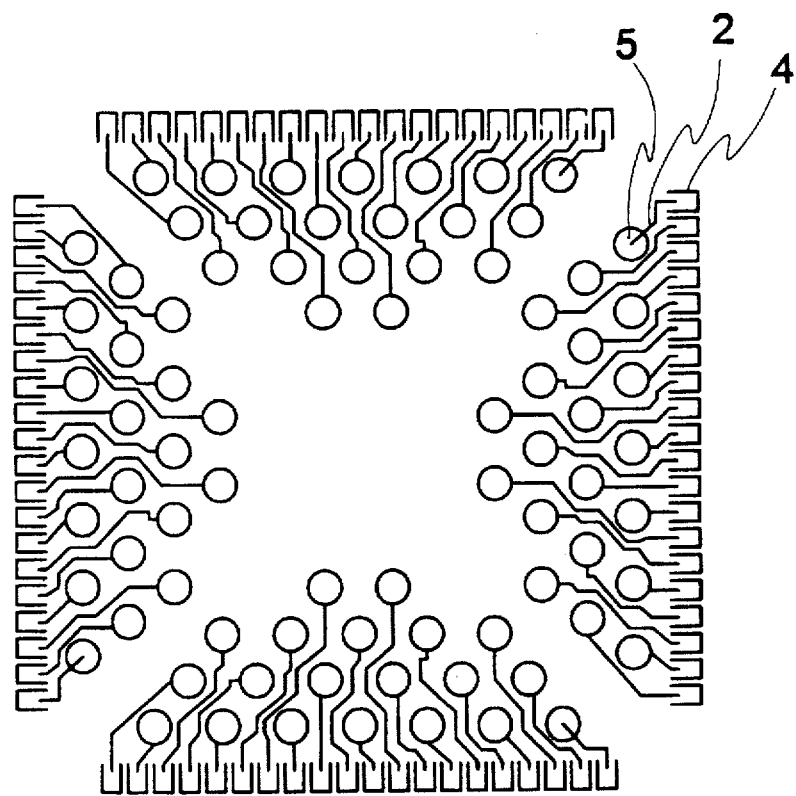
FIG. 2 is a plan view of the lead frame of the first embodiment of the present invention.

FIG. 1 is a sectional view showing the structure of the lead frame of the present invention, and FIG. 2 is a schematic plan view of the lead frame. In these drawings, 1 represents a conductive metal plate (lead frame material), 2 represents a wiring portion of the lead frame, 4 represents a first electrode portion which is electrically connected with an electrode 9 formed on the surface of the semiconductor element 8 via a metallic thin wire or the like, 5 represents a second electrode portion which is the external electrode of the semiconductor device connected to an external terminal 14 made of a solder bump, 15 represents sealing resin, 20 represents a die pad on which the semiconductor element 8 is mounted, 101 represents a tie bar, and 102 represents a lead frame.

Figure 3:
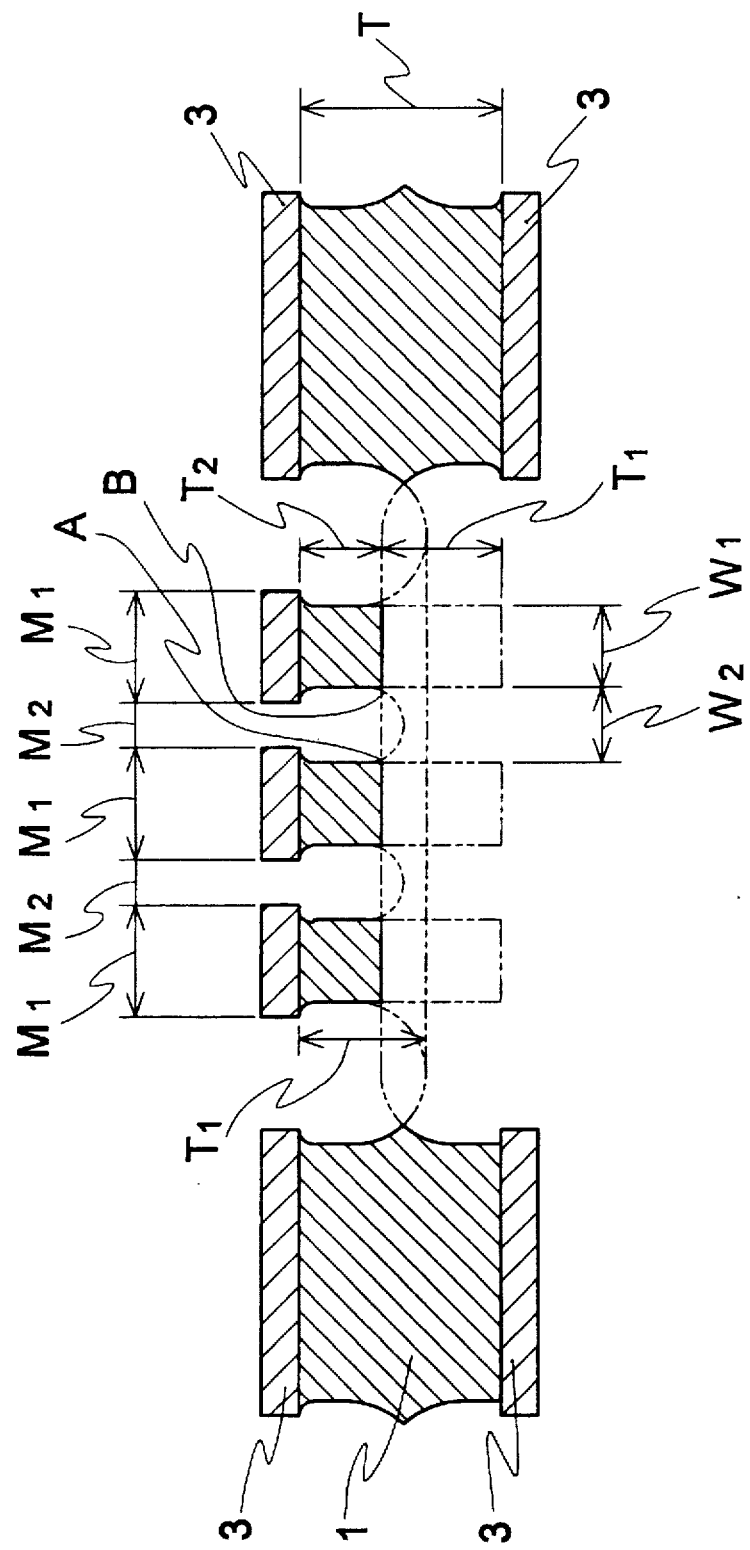
FIG. 3 is a sectional view of the lead frame of the first embodiment of the present invention.

FIG. 3 is a sectional view showing the process of producing the lead frame of the present embodiment. In this drawing, 3 represents etching masks, T indicates the thickness of the conductive metal plate 1, $T_1$ indicates the depth etched from the surface (back surface) of the conductive metal plate 1 on which the wiring portions 2 are not formed, $T_2$ indicates the thickness of the wiring portions 2 which have been made thinner by etching. $M_1$ indicates a mask pattern of the etching mask 3 to form the wiring portions 2, and $M_2$ indicates an opening of the etching mask 3 to form the interval between the wiring portions 2. $W_1$ indicates the width of the central portion of the wiring portion 2 in the thickness direction which is formed by the mask pattern $M_1$, the width being smaller than the mask pattern $M_1$ only for the etched sides. $W_2$ indicates the interval between the wiring portions 2 formed by etching, the interval being larger than the opening unit $M_2$ only for the etched sides. A and B indicate etching ends which are the pattern ends on the surfaces formed by etching from the bottom surface of the wiring portion 2, that is, from the back surface of the conductive metal plate 1. The lead frame is obtained by forming etching masks 3 having a predetermined pattern on both surfaces of the conductive meal plate 1, starting to etch both the surfaces at the same time, suspending the etching when the conductive metal plate 1 is partly penetrated and the predetermined etching ends A and B are obtained, and finally removing the etching masks 3. At this moment, the etching depth $T_1$ from the back surface becomes larger than ½ of the thickness T of the conductive metal plate 1, and the thickness $T_2$ of the wiring portions 2 becomes smaller than ½ of the thickness T of the conductive metal plate 1.

Figure 4:
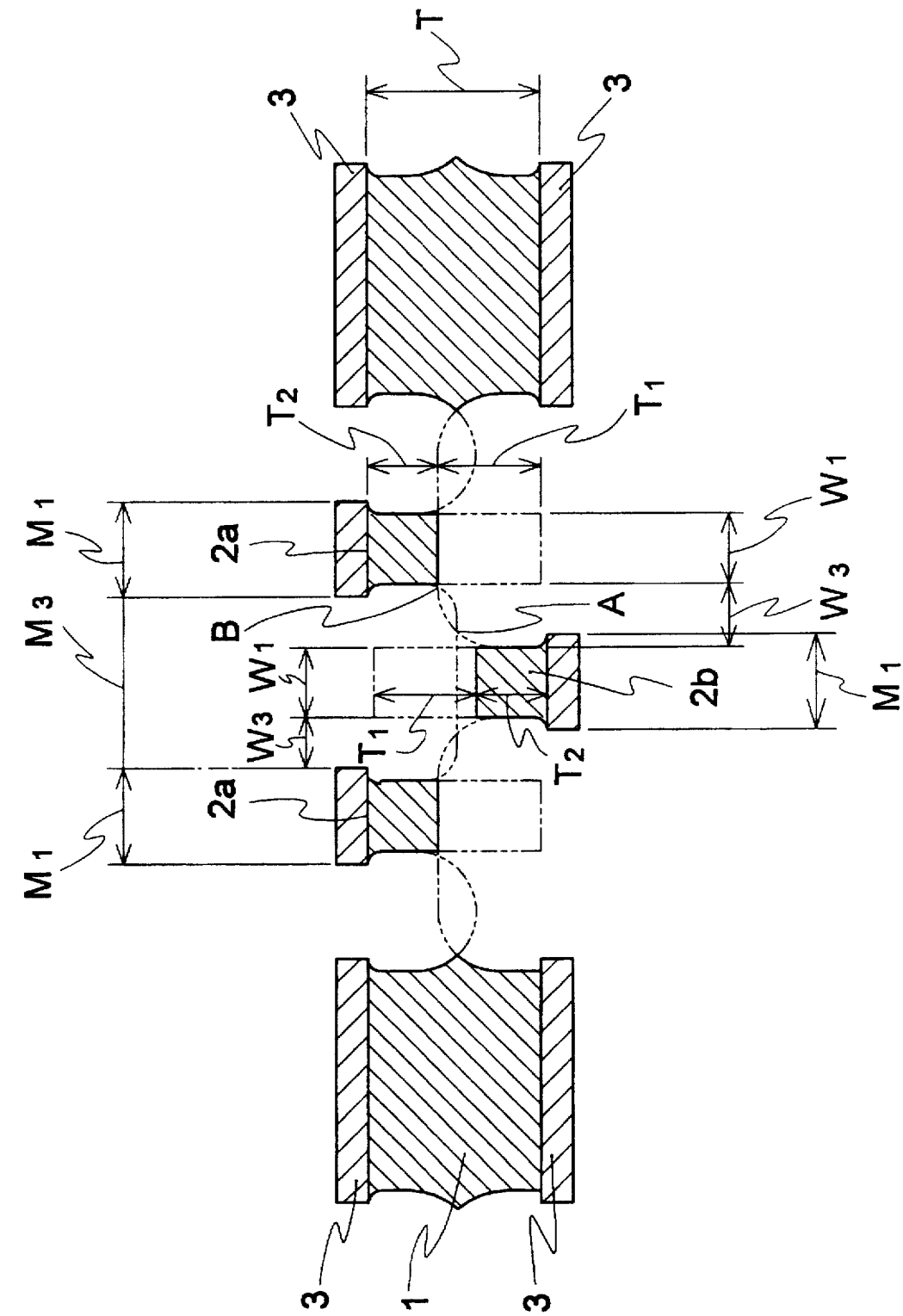
FIG. 4 is a sectional view of the lead frame of the first embodiment of the present invention.

In FIG. 3, the wiring portions 2 are provided only on one side of the conductive metal plate 1, however, as shown in FIG. 4 the wiring portions 2a and the wiring portions 2 can be alternately provided on the first side and the second side, respectively, of the conductive metal plate 1, thereby further shortening the lead pitch. In this drawing, 2a represents wiring portions for the first side of the conductive metal plate 1, 2b represents wiring portions for the second side of the conductive metal plate 1, $M_3$ represents an opening of the etching masks 3 for forming the interval between the wiring portions 2a or between the wiring portions 2b, and W3 represents the interval between adjacent wiring portions 2a and 2b which are formed on different sides of the conductive metal plate 1.

Figure 5:
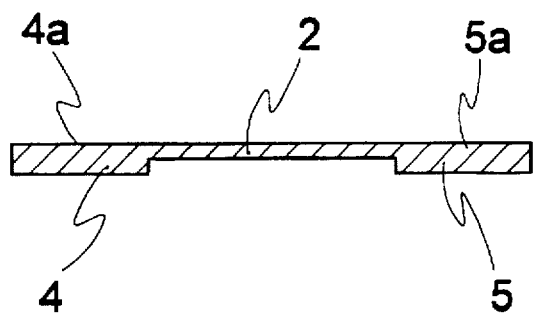
FIG. 5 is a sectional view of a lead of the lead frame of the first embodiment of the present invention.
Figure 6:
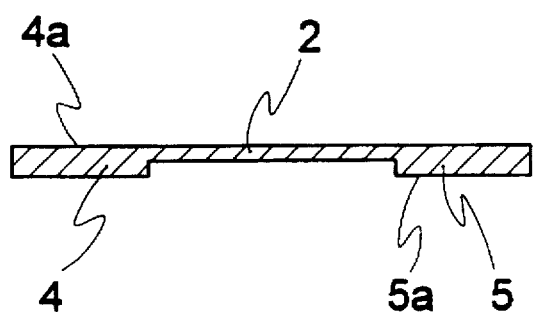
FIG. 6 is a sectional view of the lead of the lead frame of the first embodiment of the present invention.

FIGS. 5 and 6 are sectional views of one lead of the lead frame of the present embodiment. Since both surfaces of the first electrode portion 4 and the second electrode portion 5 are covered with the etching masks 3 during etching process, both the first electrode portion 4 and the second electrode portion 5 have the same thickness as the conductive metal plate 1. Although one side of the wiring portion 2 connecting the first electrode portion 4 with the second electrode portion 5 is covered with the etching mask 3 during etching process, etching is performed from the other side. Therefore, the wiring portion 2 is made thinner than the first electrode portion 4 and the second electrode portion 5.

FIG. 5 shows the case where the connecting surfaces 4a and 5a of the first electrode portion 4 and the second electrode portion 5 are disposed on the same side of the conductive metal plate 1, whereas FIG. 6 shows the case where the connecting surfaces 4a and 5a of the first electrode portion 4 and the second electrode portion 5 are disposed on the different sides of the conductive metal plate 1. Since both sides of the first electrode portion 4 and the second electrode portion 5 are non-etched plane surfaces of the conductive metal plate 1, no bonding problem is caused. Therefore, the connecting surfaces of the first electrode portion 4 and the second electrode portion 5 can be selected as desired.

In the lead frame of the present embodiment, etching is conducted from both sides of the conductive metal plate 1, thereby making the wiring portions 2 not more than half as thick as the conductive metal plate 1. As a result, the etching can be conducted under the conditions that the interval $W_2$ between the wiring portions 2 or the interval $W_3$ between the wiring portions 2a and 2b is the same as the thickness $T_2$ of the wiring portions 2, 2a, and 2b. Consequently, even if the lead pitch is made twice as thick as the thickness $T_2$ as usual, it can be shorter than the thickness T of the conductive metal plate 1.

According to the present embodiment, the second electrode portions 5 can be disposed on the internal of the first electrode portions 4, that is, on the back side of the semiconductor element 8 mounted on the die pad 20. As a result, a miniaturized semiconductor device can be achieved.

Furthermore, the process can be conducted under the conditions that the interval $W_2$ between the wiring portions 2 is about the same as the thickness $T_2$ of the wiring portion 2 by making the thickness $T_2$ of the wiring portions 2 thinner. Therefore, the lead pitch can be shortened and fine wiring becomes possible. In addition, when the wiring portions 2a of the first side of the conductive metal plate 1 and the wiring portions 2b of the second side of the conductive metal plate 1 are disposed alternately, the interval $W_3$ between adjacent wiring portions 2a and 2b formed on different sides of the conductive metal plate 1 can be made shorter than the interval $W_2$ of the wiring portions 2, and as a result, the lead pitch can be further shortened. Furthermore, the connecting surfaces of the first electrode portions 4 and the second electrode portions 5 can be determined as desired, so that the flexibility of the arrangement of the semiconductor element electrodes and the external electrodes of the semiconductor device is increased.

Embodiment 2

In the first embodiment, the first electrode portions 4 and the second electrode portions 5 have the same thickness as the conductive metal plate 1. However, as shown in FIGS. 7 and 8, the interval between the second electrode portions 5 can be made shorter by making the second electrode portions 5 thinner by etching from one side in the etching process, in the same manner as the wiring portions 2.

Figure 7:
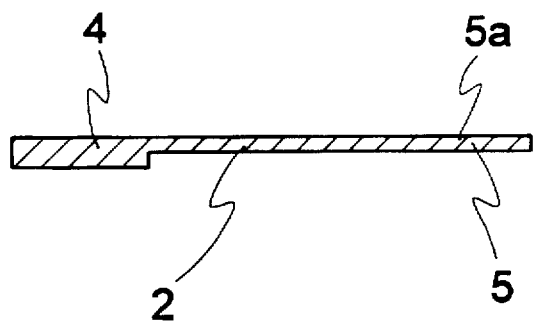
FIG. 7 is a sectional view of a lead of a lead frame of the second embodiment of the present invention.
Figure 8:
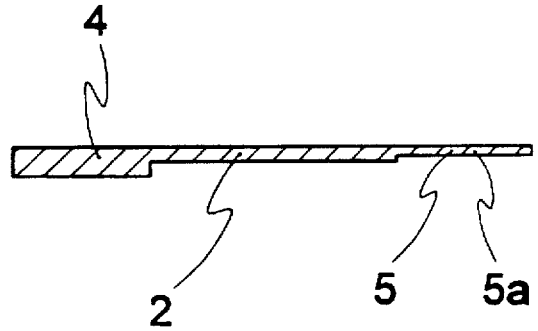
FIG. 8 is a sectional view of the lead of the lead frame of the second embodiment of the present invention.

In FIG. 7, the connecting surface 5a of the second electrode portion 5 is provided on the side which has not been etched. However, as shown in FIG. 8, when it is necessary to provide the connecting surface 5a of the second electrode portion 5 on the etched side, the connecting surface can be made plane by applying a pressing (compressing), which has been conventionally conducted to make a lead end plane, to the second electrode portion 5, without causing bonding problem. However, if the second electrode portion 5 is made thinner by pressing, when the second electrode portion 5 has a thickness $T_1$, lead width $W_1$, and a reduced amount $\angle T_2$, then $\angle T_2$ becomes equal to $\epsilon T_2$, and the increased lead width becomes equal to $v \times (\angle T_2 / T_2) \times (W_1)$, which indicates that the lead interval becomes shorter only for the increased lead width. Therefore, the pressing operation for making the second electrode portion 5 thinner should not be done more than making the rough etched surface plane.

In the present embodiment, the interval between the second electrode portions 5 can be made shorter by making the second electrode portion 5 thinner. As a result, a minimized semiconductor device can be achieved.

Embodiment 3

In the second embodiment, the second electrode portions 5 are made thinner. However, as shown in FIGS. 9 and 10, the interval between the first electrode portions 4 can be made shorter by making the first electrode portions 4 thinner by etching from one side in the etching process, in the same manner as the wiring portions 2.

Figure 9:
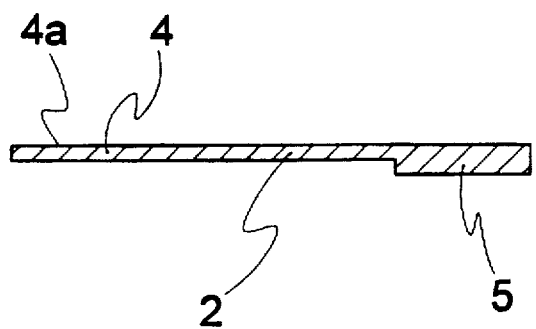
FIG. 9 is a sectional view of a lead of a lead frame of the third embodiment of the present invention.
Figure 10:
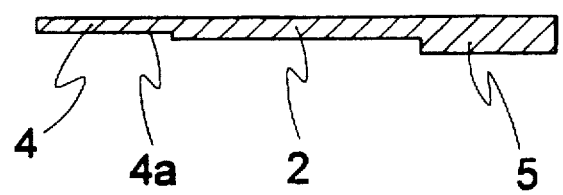
FIG. 10 is a sectional view of the lead of the lead frame of the third embodiment of the present invention.

In FIG. 9, the connecting surface 4a of the first electrode portion 5 is provided on the side which has not been etched. However, as shown in FIG. 10, when it is necessary to provide the connecting surface 4a of the first electrode portion 4 on the etched side, the connecting surface can be made plane by a pressing process in the same manner as in the second embodiment, without causing bonding problem.

In the present embodiment, the interval between the electrodes can be made shorter by making the first electrode portions 4 thinner. As a result, the embodiment can meet desire of a larger number of pins and a smaller pitch in the semiconductor element.

Embodiment 4

Figure 11:
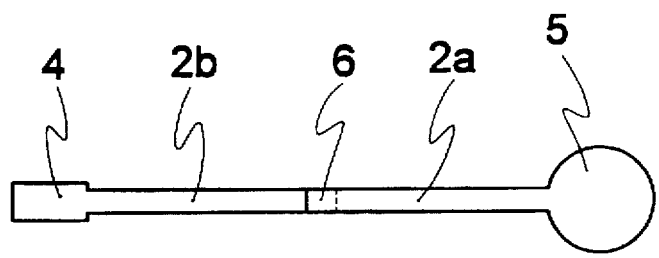
FIG. 11 is a plan view of a lead of a lead frame of the fourth embodiment of the present invention.
Figure 12:
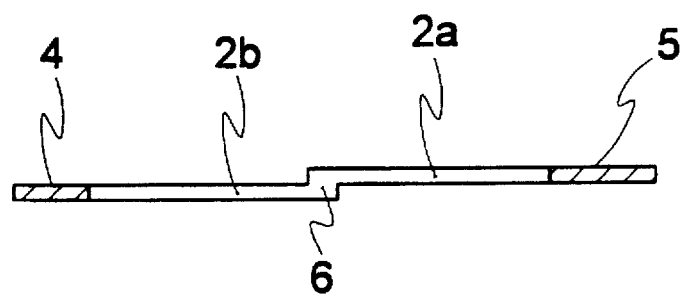
FIG. 12 is a side view of the lead of the lead frame of the fourth embodiment of the present invention.

FIGS. 11 and 12 are a plan view and a side view of one lead of the lead frame of the fourth embodiment of the present invention. In these drawings, 2a and 2b represent wiring portions which have been made thinner by being etched from one side when the lead frame is formed; 2a is a wiring portion formed on the first side of the conductive metal plate 1, and 2b is a wiring portion formed on the second side of the conductive metal plate 1. 4 represents a first electrode portion and 5 represents a second electrode portion, both of which are made thinner. 6 represents a connecting portion between the wiring portion 2a on the first side and the wiring portion 2b on the second side, which is not etched when the lead frame is formed because both sides are covered with etching masks.

In the present embodiment, the portions other than the connecting portion 6 of the lead are made thinner by being etched from one side, which makes fine wiring possible. As shown in FIG. 12, the use of the connecting portion 6 makes it possible to dispose the first electrode portion 4 and the wiring portion 2a on the first side of the conductive metal plate 1 and to dispose the second electrode portion 5 and the wiring portion 2b on the second side of the conductive metal plate 1, thereby achieving a three-dimensional distributive arrangement. As a result, wiring with higher density can be realized and a miniaturized semiconductor device can be achieved.

Embodiment 5

Figure 13:
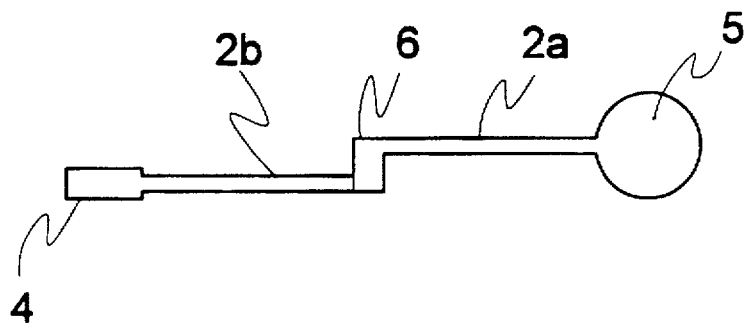
FIG. 13 is a plan view of a lead of a lead frame of the fifth embodiment of the present invention.
Figure 14:
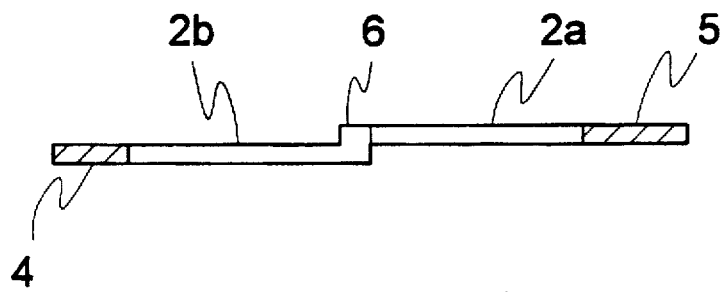
FIG. 14 is a side view of the lead of the lead frame of the fifth embodiment of the present invention.
Figure 15:
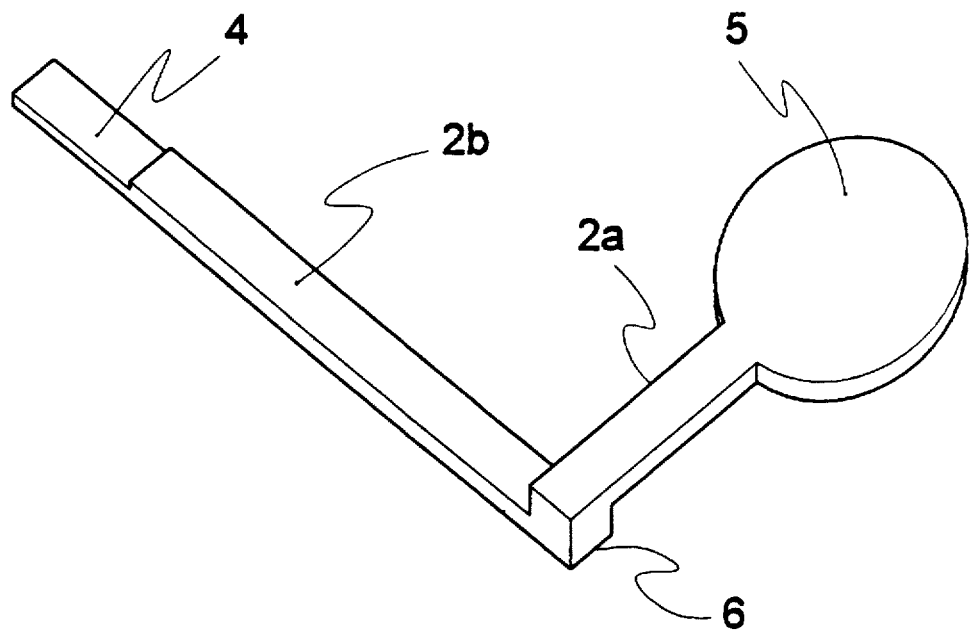
FIG. 15 is a plan view of the lead of the lead frame of the fifth embodiment of the present invention.

In the fourth embodiment, the first electrode portion 4, the second electrode portion 5, and the wiring portions 2a and 2b are placed in a straight line. However, as shown in FIGS. 13 to 15, the first electrode portions 4 and the second electrode portion 5 can be placed at any position by disposing the wiring portions 2a and 2b which connect the first electrode portion 4 and the second electrode portion 5 in such a manner that the wiring portions 2a and 2b change their directions at a right angle in the middle. As a result, the flexibility of the arrangement of the semiconductor element electrodes and the external electrodes of the semiconductor device can be increased, which makes it possible to further miniaturize the semiconductor device.

FIGS. 13 and 14 are a plan view and a side view of a lead which is applicable when the first electrode portion 4, the second electrode portion 5, and the wiring portions 2a and 2b are not on a straight line. FIG. 15 is a perspective view of a lead which is applicable when it is necessary to dispose the wiring portions 2a and 2b at a right angle.

In the present embodiment, the first electrode portion 4 and the second electrode portion 5 can be placed at any location, so that the flexibility of the arrangement of the semiconductor element electrodes and the external electrodes of the semiconductor device is increased, which makes it possible to further miniaturize the semiconductor device.

Embodiment 6

Figure 16:
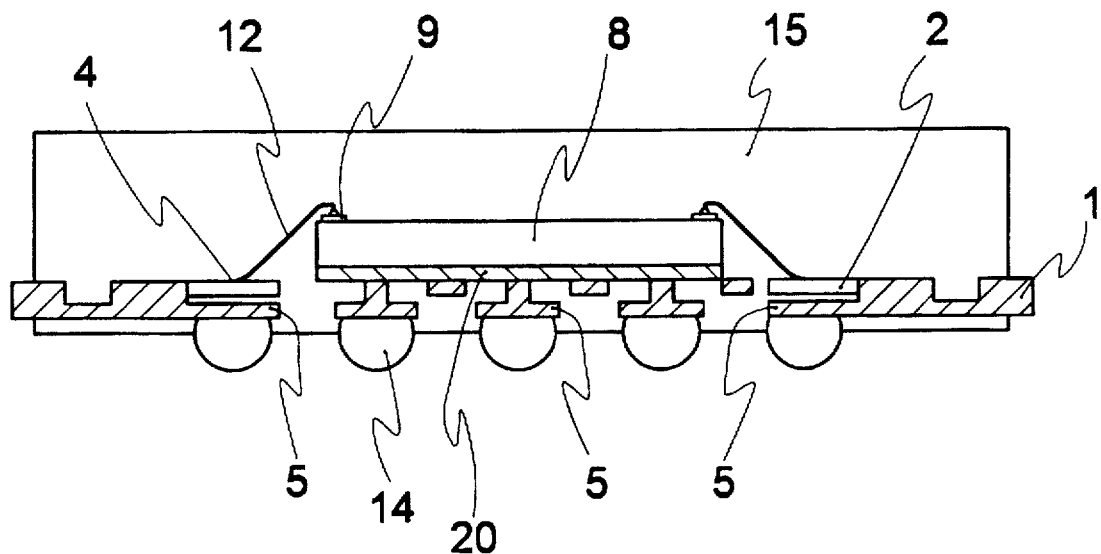
FIG. 16 is a side and sectional view of a lead frame of the sixth embodiment of the present invention.
Figure 17:
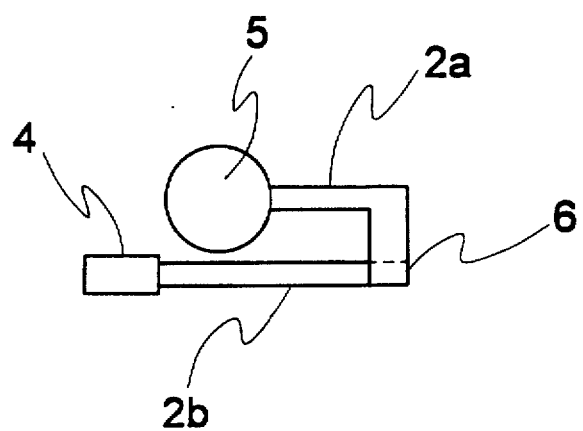
FIG. 17 is an explanatory view of a lead of the lead frame of the sixth embodiment of the present invention.
Figure 18:
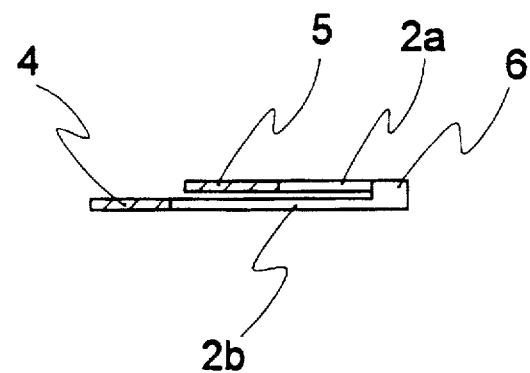
FIG. 18 is an explanatory view of the lead of the lead frame of the sixth embodiment of the present invention.

FIG. 16 is a sectional view of a lead frame of the sixth embodiment of the present invention, and FIGS. 17 and 18 are a plan view and a side view of one lead of the lead frame shown in FIG. 16. Since the reference numerals in these drawings represent the same components as those in FIG. 1, their explanation is omitted here.

When the first electrode portion 4 and the second electrode portion 5 are close to each other as shown in FIG. 16, the U-shaped lead can be used for wiring as shown in FIGS. 17 and 18, thereby achieving a miniaturized semiconductor device.

Embodiment 7

Figure 19:
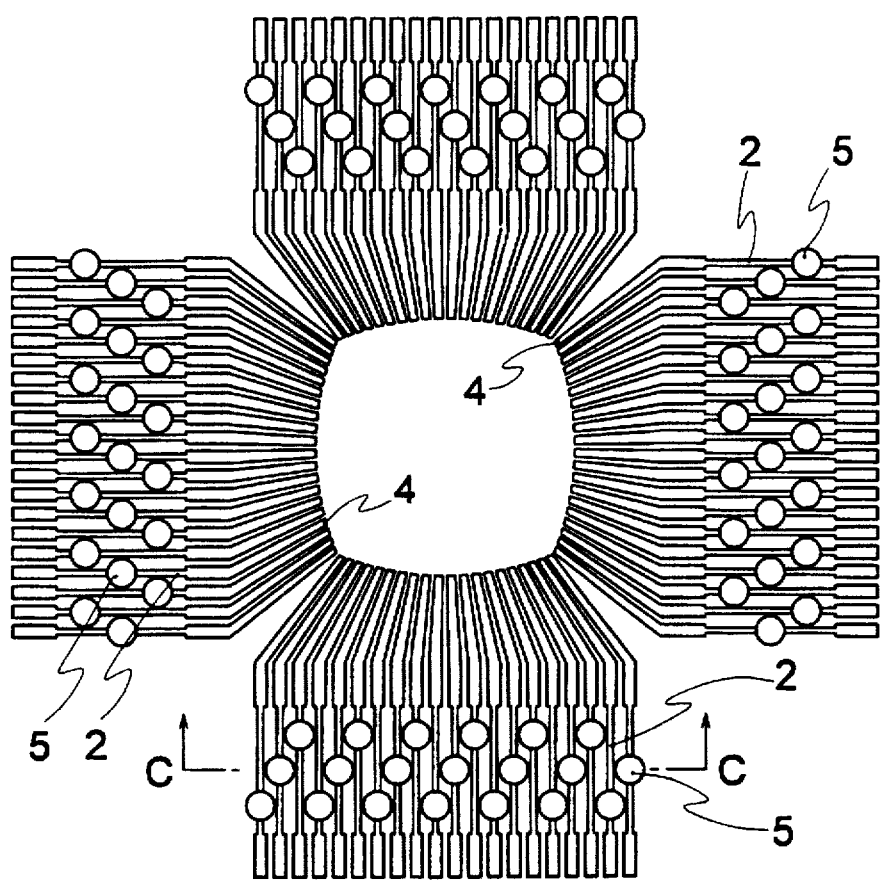
FIG. 19 is a plan view of a lead frame of the seventh embodiment of the present invention.
Figure 20:
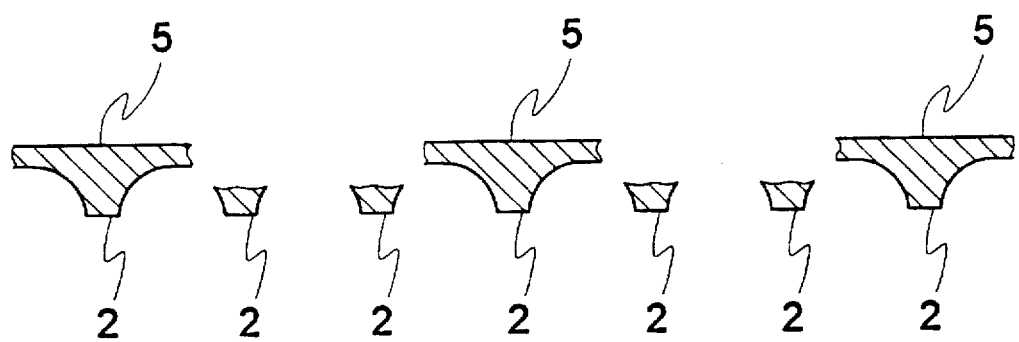
FIG. 20 is a sectional view of the lead frame of the seventh embodiment of the present invention.
Figure 21:
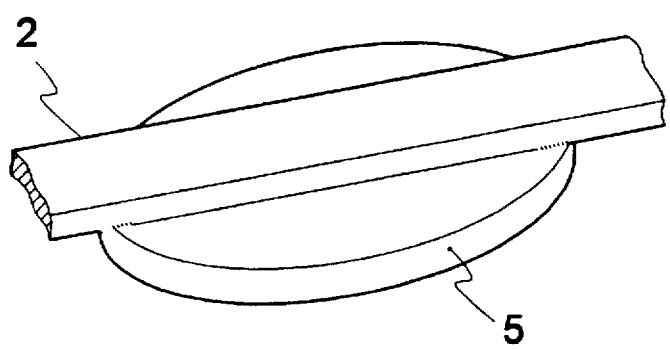
FIG. 21 shows a perspective view of a second electrode portion of the lead frame of the seventh embodiment of the present invention.
Figure 22:
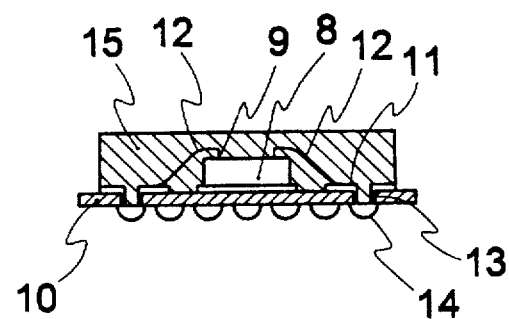
FIG. 22 is a sectional view of a resin-sealing semiconductor device in which a semiconductor element is mounted on a conventional printed wiring board.
Figure 23:
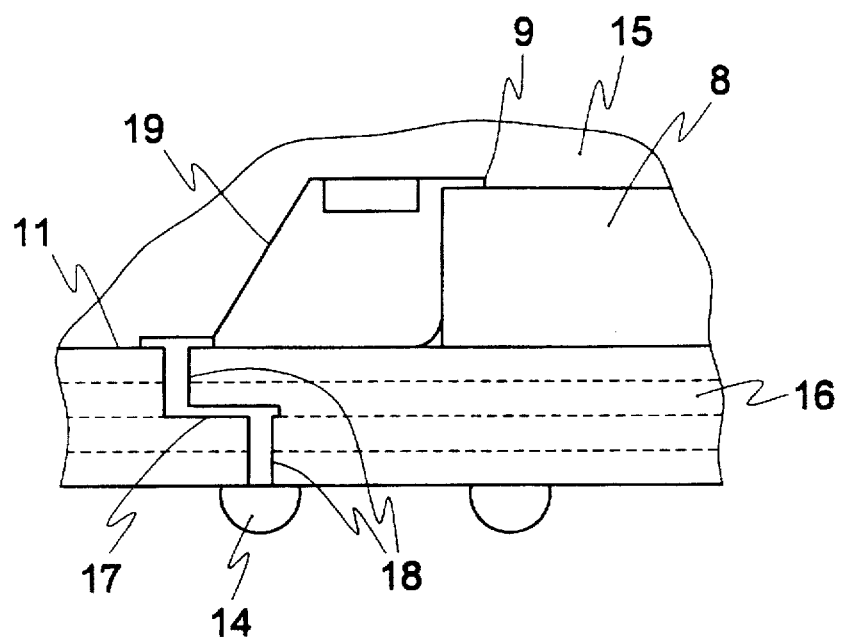
FIG. 23 is a sectional view of another resin-sealing semiconductor device in which a semiconductor element is mounted on a conventional printed wiring board.
Figure 24:
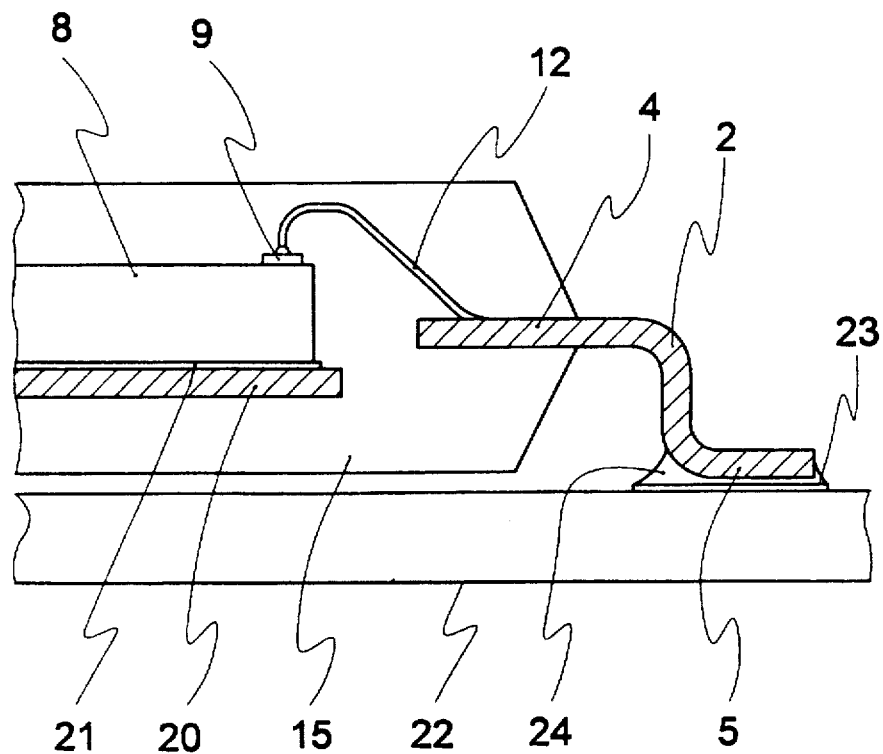
FIG. 24 is a sectional view of a resin-sealing semiconductor device which employs a conventional lead frame.
Figure 25:
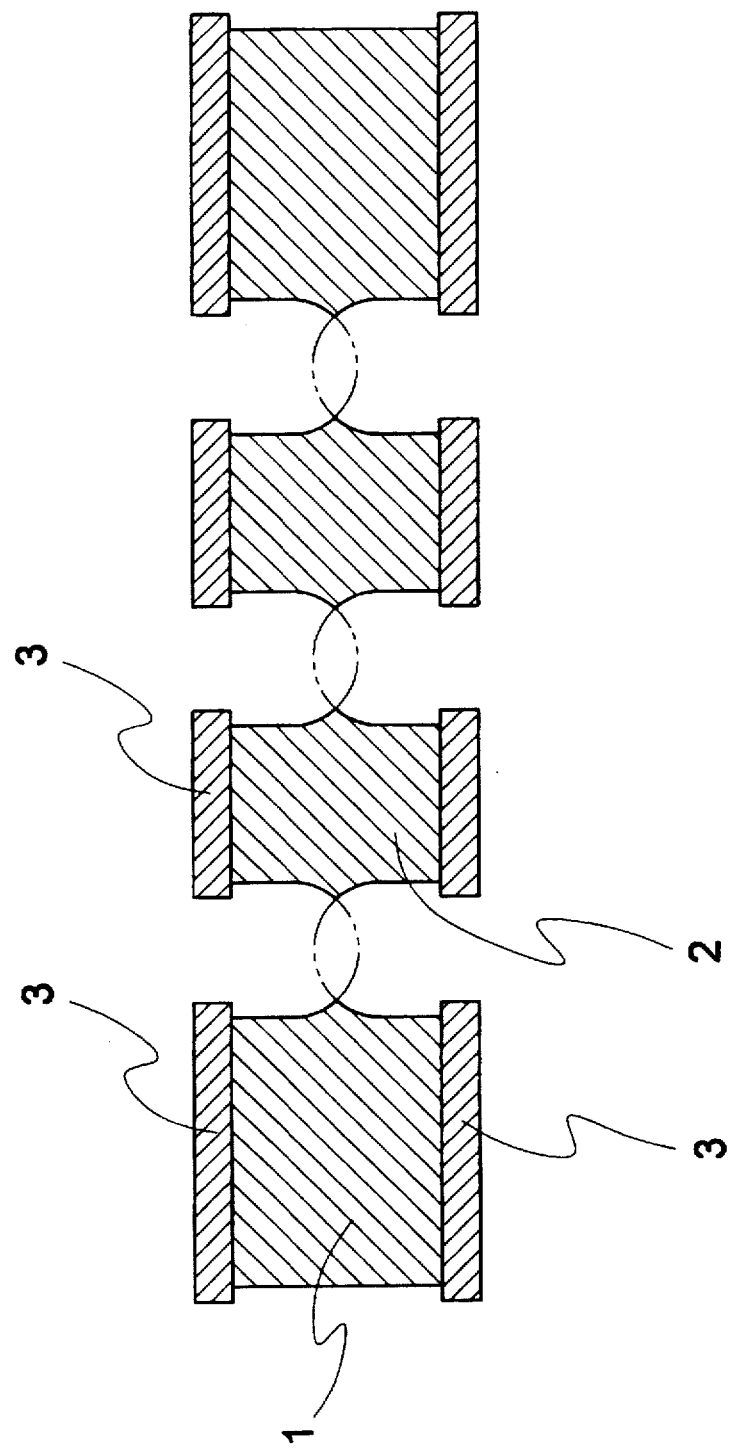
FIG. 25 is a sectional view of a conventional lead frame.
Figure 26A:
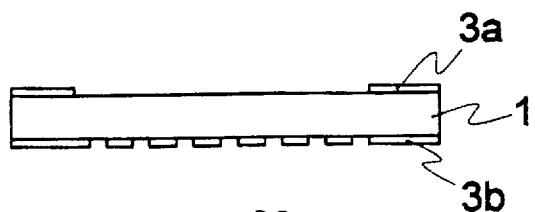
FIG. 26 is a sectional view showing a process of forming another conventional lead frame.
Figure 26B:
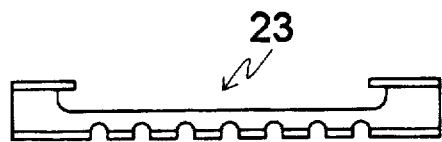
Figure 26C:
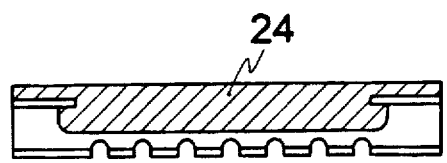
Figure 26D:
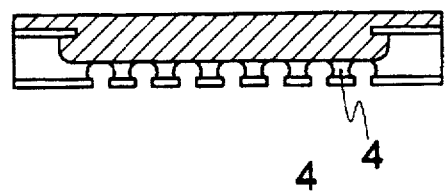
Figure 26E:
Figure 27:
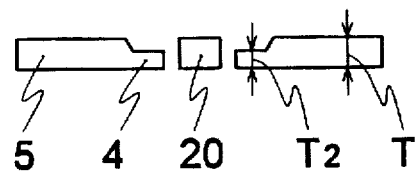
FIG. 27 is a sectional view of another conventional lead frame.
Figure 28:
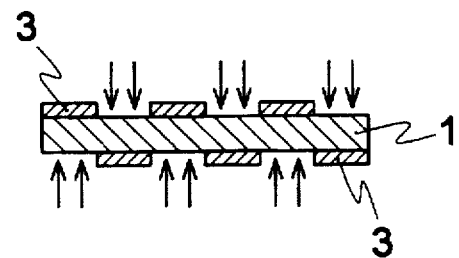
FIG. 28 is a sectional view showing a process of forming further another conventional lead frame.

FIG. 19 is a plan view of a lead frame of the seventh embodiment of the present invention, FIG. 20 is a sectional view taken along the line C—C of FIG. 19, and FIG. 21 is a perspective view of the second electrode portion 5. The wiring portions 2 are formed on the second side of the lead frame material, and the second electrode portions 5 are formed on the first side thereof. The portion where a wiring portion 2 and a second electrode portion 5 are overlapped, a circle which is the shape of the second electrode portion 5 is patterned on the first side by etching whereas the wiring pattern is formed on the second side by etching. In the other points, the present embodiment has the same construction as the fourth embodiment, and the present embodiment represents a case where the second electrode portion 5 is formed on the connecting portion 6 as shown in FIG. 11.

In the present embodiment, the wiring portions 2 and the second electrode portions 5 which are wider than the wiring portions 2 are formed on different sides from each other and at least one wiring portion 2 is disposed between adjacent second electrode portions 5, so as not to arrange the wide second electrode portions 5 laterally in a line. As a result, there is no need to widen the interval between the wiring portions 2 to form the second electrode portions 5, which achieves wiring with higher density and a miniaturized semiconductor device.

Embodiment 8

In the seventh embodiment, the second electrode portions 5 and the wiring portions 2 are overlapped. However, the semiconductor element electrodes can have a smaller pitch by forming the first electrode portions 4 and the wiring portions 2 on different sides and by disposing a wiring portion 2 between adjacent first electrode portions 4 so as not to arrange the first electrode portions 4 laterally in a line.

As explained hereinbefore, in the present invention, fine wiring can be achieved by making the lead as a wiring member for electrically connecting the semiconductor element electrodes with the external electrodes of the semiconductor device not more than half as thick as the lead frame material at need. Furthermore, a semiconductor element having a larger number of pins and a smaller pitch can be achieved by using a lead frame which includes the wiring and electrode portions disposed on both sides of the lead frame material. In addition, a smaller semiconductor device with lower cost can be achieved by disposing the external electrodes on the back side of the semiconductor elements.

What is claimed is:

1. A wiring member comprising a first electrode portion electrically connected with an electrode formed on a surface of a semiconductor element, a second electrode portion electrically connected with an electrode formed on an external circuit, and a wiring portion which connects the first electrode portion with the second electrode portion, wherein the first electrode portion, the second electrode portion and the wiring portion are formed of a plate-shaped conductive body, and a thickness of the wiring portion is made not more than half as thick as the first electrode portion or the second electrode portion.

2. The wiring member of claim 1, wherein the wiring portion is provided on one surface of the plate-shaped conductive body.

3. The wiring member of claim 1, wherein the wiring portions are dispersedly provided on both surfaces of the plate-shaped conductive body.

4. The wiring member of claim 1, wherein a thickness of the first electrode portion and a thickness of the second electrode portion are the same as that of the plate-shaped conductive body.

5. The wiring member of claim 2, wherein a thickness of the first electrode portion and a thickness of the second electrode portion are the same as that of the plate-shaped conductive body.

6. The wiring member of claim 3, wherein a thickness of the first electrode portion and a thickness of the second electrode portion are the same as that of the plate-shaped conductive body.

7. The wiring member of claim 1, wherein a thickness of either the first electrode portion or the second electrode portion is the same as that of the palte-shaped conductive body, and a thickness of the other is not more than half of that of the plate-shaped conductive body.

8. The wiring member of claim 2, wherein a thickness of either the first electrode portion or the second electrode portion is the same as that of the palte-shaped conductive body, and a thickness of the other is not more than half of that of the plate-shaped conductive body.

9. The wiring member of claim 3, wherein a thickness of either the first electrode portion or the second electrode portion is the same as that of the palte-shaped conductive body, and a thickness of the other is not more than half of that of the plate-shaped conductive body.

10. The wiring member of claim 7, wherein the first electrode portion or the second electrode portion whose thickness is not more than half of that of the plate-shaped conductive body is pressed to make their surfaces plane.

11. The wiring member of claim 8, wherein the first electrode portion or the second electrode portion whose thickness is not more than half of that of the plate-shaped conductive body is pressed to make their surfaces plane.

12. The wiring member of claim 9, wherein the first electrode portion or the second electrode portion whose thickness is not more than half of that of the plate-shaped conductive body is pressed to make their surfaces plane.

13. The wiring member of claim 1, wherein the wiring portion is formed of the plate-shaped conductive body by etching.

14. The wiring member of claim 1, wherein at least one surface of the first electrode portion or the second electrode portion has not been subjected to etching process.

15. A wiring member comprising a first electrode portion electrically connected with an electrode formed on a surface of a semiconductor element, a second electrode portion electrically connected with an electrode formed on an external circuit, a wiring portion which connects the first electrode portion with the second electrode portion, and a connecting portion formed in a part of the wiring portion to connect the wiring portion, wherein the first electrode portion, the second electrode portion, the wiring portion and the connecting portion are formed of a plate-shaped conductive body, and each thickness of the first electrode portion, the second electrode portion, and the wiring portion is made not more than half as thick as the connecting portion.

16. The wiring member of claim 15, wherein the connecting portion is a portion where the wiring portion and either of the first electrode portion or the second electrode portion which is wider than the wiring portion are overlapped with each other.

17. The wiring member of claim 16, wherein the connecting portions including either of the first electrode portion or the second electrode portion formed on adjacent wiring portions are arranged not to align laterally.

18. The wiring member of claim 15, wherein the wiring portion is formed of the plate-shaped conductive body by etching.

19. The wiring member of claim 15, wherein at least one surface of the first electrode portion or the second electrode portion has not been subjected to etching process.

20. A lead frame including a plurality of wiring members, the wiring member comprising a first electrode portion electrically connected with an electrode formed on a surface of a semiconductor element, a second electrode portion electrically connected with an electrode formed on an external circuit, and a wiring portion which connects the first electrode portion with the second electrode portion, wherein the first electrode portion, the second electrode portion and the wiring portion are formed of a plate-shaped conductive body, and a thickness of the wiring portion is made not more than half as thick as the first electrode portion or the second electrode portion.

* * * * *